(12) United States Patent
Young, Jr.

(10) Patent No.: US 6,578,600 B1
(45) Date of Patent: Jun. 17, 2003

(54) GAS ISOLATION BOX

(75) Inventor: Robert Raymond Young, Jr., Clinton Corners, NY (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 09/702,312

(22) Filed: Oct. 31, 2000

(51) Int. Cl.⁷ .............................................. F16K 35/00
(52) U.S. Cl. ...................... 137/377; 137/382; 137/383; 118/715
(58) Field of Search ................................ 137/377, 382, 137/883; 118/715

(56) References Cited

U.S. PATENT DOCUMENTS

| | | | |
|---|---|---|---|
| 3,608,519 A | * 9/1971 | Bean et al. .................. 118/725 |
| 5,020,570 A | * 6/1991 | Cotter .................... 137/596.12 |
| 5,163,475 A | * 11/1992 | Gregoire ..................... 137/597 |
| 5,732,744 A | 3/1998 | Barr et al. ................... 118/715 |
| 5,915,414 A | 6/1999 | Seaman et al. ............. 137/377 |
| 6,076,543 A | 6/2000 | Johnson ....................... 137/382 |

\* cited by examiner

Primary Examiner—A. Michael Chambers
(74) Attorney, Agent, or Firm—Ira D. Blecker

(57) ABSTRACT

A gas isolation box including an enclosure; a number of gas sticks contained within the enclosure, each gas stick including a process gas section comprising a first process gas inlet valve for gating the flow of a process gas into the gas stick; a purge gas section including a purge valve for gating the flow of a purge gas into the gas stick; and an evacuation section including a first evacuation valve for gating the exiting of a process gas or a purge gas from the gas stick, a bleed valve which in a closed position allows process gas to bleed through the bleed valve and in an open position allows purge gas to freely flow through the bleed valve, and a vacuum generator module which pulls a vacuum to evacuate a purge gas or any remaining process gas in the gas stick or the tool through the first evacuation valve and the bleed valve and out from the gas stick to an exhaust stream.

58 Claims, 7 Drawing Sheets

GAS ISOLATION BOX

FIELD OF THE INVENTION

The present invention relates generally to gas handling devices, and more particularly, relates to gas handling devices that are capable of supplying, evacuating and purging a process gas and are also capable of handling multiple process gases in a single gas handling device.

BACKGROUND OF THE INVENTION

In a semiconductor manufacturing process, a variety of process tools are utilized, such as steppers, etchers and the like, each of which requires a constant supply of process gases in order to produce semiconductor devices of uniform quality. A tool may require multiple supply lines of process gases, such as nitrogen, oxygen, hydrogen, boron trichloride, fluorine, silicon tetrafluoride, silane, argon, etc. Many process gases are flammable, toxic and/or pyrophoric and therefore require special precautions in order to be utilized safely.

A conventional gas handling device, also known as a gas isolation box, typically includes a plurality of gas handling units, also known as gas sticks or gas isolation assemblies. For the sake of simplicity, the gas handling device will be referred to hereafter as a gas isolation box or GIB and the gas handling units will be referred to hereafter as gas sticks.

Each gas stick may have various stop valves, mass flow controllers, pressure transducers, filters, etc. which are coupled to each other by various types of union fittings as is well known to those skilled in the art. The gas sticks are also coupled to a gas inlet which provides process gas from a remote gas supply and to a gas outlet which leads to a tool, sometimes remotely located. The components of each gas stick are rigidly fastened to a mounting block. The components of each gas stick so mounted on the mounting block are then positioned within an enclosure to make up the GIB. For safety reasons, all tubing coming to the GIB is welded to the GIB to avoid leaks.

Various GIBs are illustrated in the prior art including those shown in Barr et al. U.S. Pat. No. 5,732,744, Seaman et al. U.S. Pat. No. 5,915,414, and Johnson U.S. Pat. No. 6,076,543, the disclosures of which are incorporated by reference herein. As disclosed in Seaman et al., a plurality of gas sticks are located in an enclosure. Purge gas is supplied from a manifold and is manually controlled external to the GIB.

Several disadvantages are apparent from the prior art. First, some functions of the GIB, such as purging, are not contained within the GIB so extra room around the GIB need be made to account for the external functions. Second, only one process gas is supplied to a given GIB. Thus, there needs to be multiple GIBs to accommodate multiple process gases. Third, conventional GIBs are manually controlled which necessarily requires an operator to be available to attend to the GIB. Fourth, the functions present in conventional GIBs are limited.

It would be desirable to have a GIB which resolves the difficulties inherent in conventional GIBs.

Accordingly, it is a purpose of the present invention to have all functions of the GIB contained within the GIB.

It is another purpose of the present invention to have a GIB that can handle multiple process gases at the same time.

It is yet another purpose of the present invention to have a GIB which is controlled pneumatically and/or electronically.

It is still another purpose of the present invention to have a GIB which can handle multiple functions of supply, evacuate and purge of a process gas.

These and other purposes of the present invention will become more apparent after referring to the following description of the invention considered in conjunction with the accompanying drawings.

BRIEF SUMMARY OF THE INVENTION

The purposes of the invention have been achieved by providing, according to a first aspect of the invention a gas stick comprising:

a process gas section comprising a first process gas inlet valve for gating the flow of a process gas into the gas stick;

a purge gas section comprising a purge valve for gating the flow of a purge gas into the gas stick; and an evacuation section comprising a first evacuation valve for gating the exiting of a process gas or a purge gas from the gas stick, a bleed valve which in a closed position allows process gas to bleed through the bleed valve and in an open position allows purge gas to freely flow through the bleed valve, and a vacuum generator module which pulls a vacuum to evacuate a purge gas or any remaining process gas in the gas stick or the tool through the first evacuation valve and the bleed valve and out from the gas stick to an exhaust stream.

According to a second aspect of the invention, there is provided a gas isolation box comprising:

an enclosure;
a plurality of gas sticks contained within the enclosure, each gas stick comprising:

a process gas section comprising a first process gas inlet valve for gating the flow of a process gas into the gas stick;

a purge gas section comprising a purge valve for gating the flow of a purge gas into the gas stick; and an evacuation section comprising a first evacuation valve for gating the exiting of a process gas or a purge gas from the gas stick, a bleed valve which in a closed position allows process gas to bleed through the bleed valve and in an open position allows purge gas to freely flow through the bleed valve, and a vacuum generator module which pulls a vacuum to evacuate a purge gas or any remaining process gas in the gas stick or the tool through the first evacuation valve and the bleed valve and out from the gas stick to an exhaust stream.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
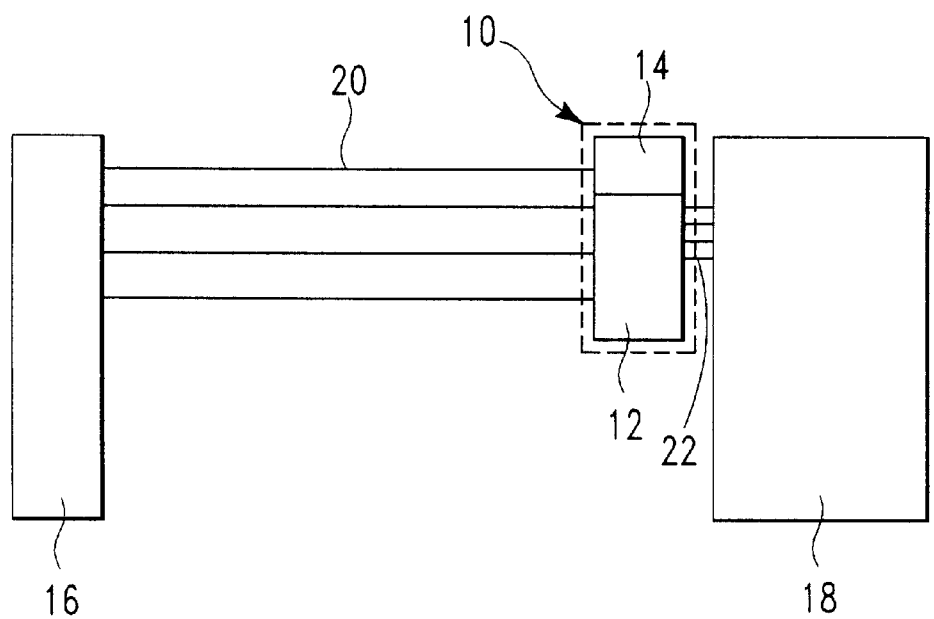
FIG. 1 is a block diagram of the gas isolation box according to the present invention in close proximity to a process tool.

Referring to the Figures in more detail, and particularly referring to FIG. 1, there is shown the environment in which the gas isolation box (hereafter GIB) of the present invention is located. GIB 10, consisting of enclosure 14 containing the gas sticks and control module 12, is located proximate to tool 18. Process gases are supplied to GIB 10 by supply lines 20 from gas supply cabinet 16. There may be additional supply lines 22 which supply the tool 18 from GIB 10.

Figure 2:
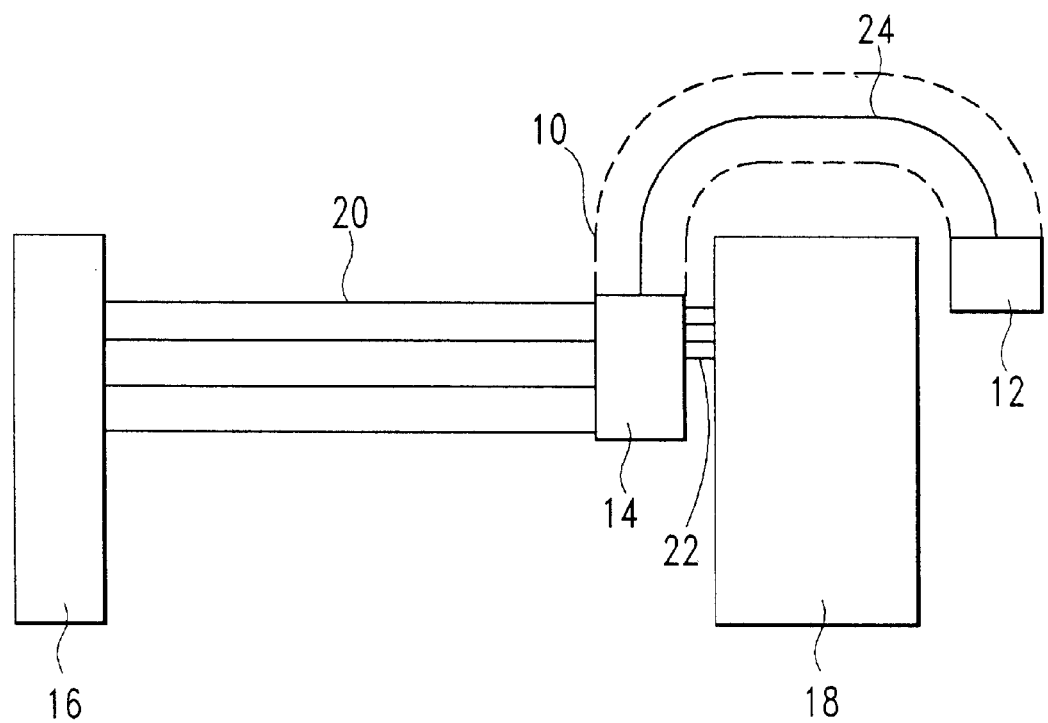
FIG. 2 is a block diagram similar to FIG. 1 except that the control module of the gas isolation box is located remotely.

The environment shown in FIG. 2 is identical to that shown in FIG. 1 except that the control module 12 of the GIB 10 according to the present invention is located remotely from the enclosure 14. For example, the enclosure 14 may be mounted on a wall or in the floor while the control module 12 is mounted near the tool. Control module 12 and enclosure 14 communicate over wiring 24.

Figure 3:
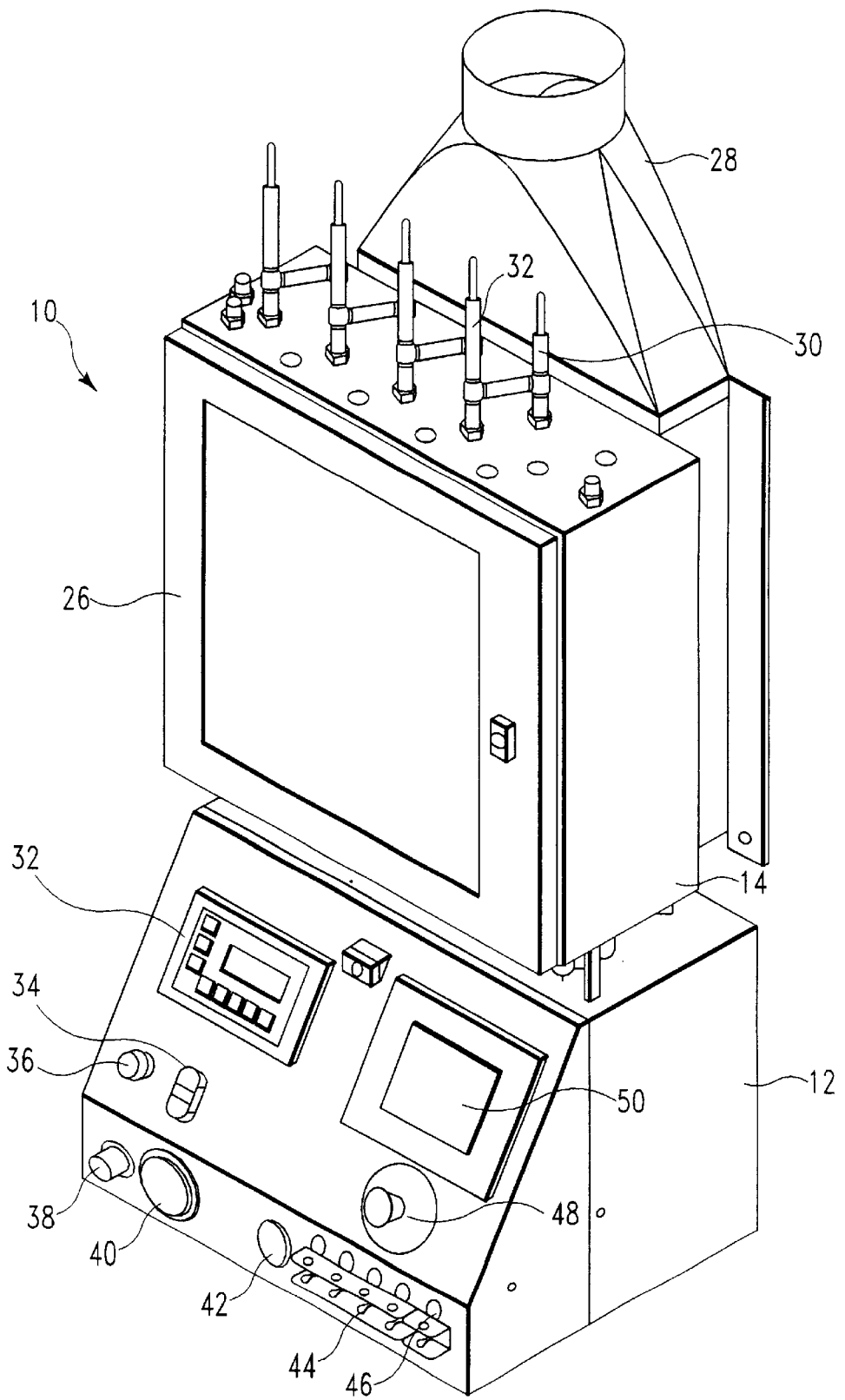
FIG. 3 is a perspective schematical drawing of the gas isolation box according to the present invention.

Referring now to FIG. 3, there is shown a preferred embodiment of the GIB 10 which is mounted on a wall or column. Enclosure 14 has a door 26 to provide access to the gas sticks in the enclosure 14. At the top of the enclosure 14 are supply lines 30 which supply process gases from the supply cabinet 16 shown in FIGS. 1 and 2 to the gas sticks and outlet lines 32 which supply process gases to the tool from the gas sticks. It is preferred that enclosure 14 be mounted adjacent to exhaust 28.

In a preferred embodiment of the invention, the functions of the gas sticks are controlled by controlled module 12. The appearance of control module 12 shown in FIG. 3 is for purposes of illustration only and not limitation. On the face of control module 12 are various controls including active channel selector 32 which selects the gas stick to be controlled on the operator interface 50; on/off switch 34 for the control module 12; inadequate purge indicator 36, purge regulator 38, and pressure gauge 40 which monitor and control the pressure in the enclosure 14; pneumatic pressure gauge 42; pneumatic lockouts 44 which pneumatically inhibit the operation of the inlet valve of the respective gas stick; pneumatic indicators 46 which indicate whether the inlet valve for each gas stick is enabled or locked out; and emergency off (EMO) button which closes all valves in the gas sticks.

Figure 4:
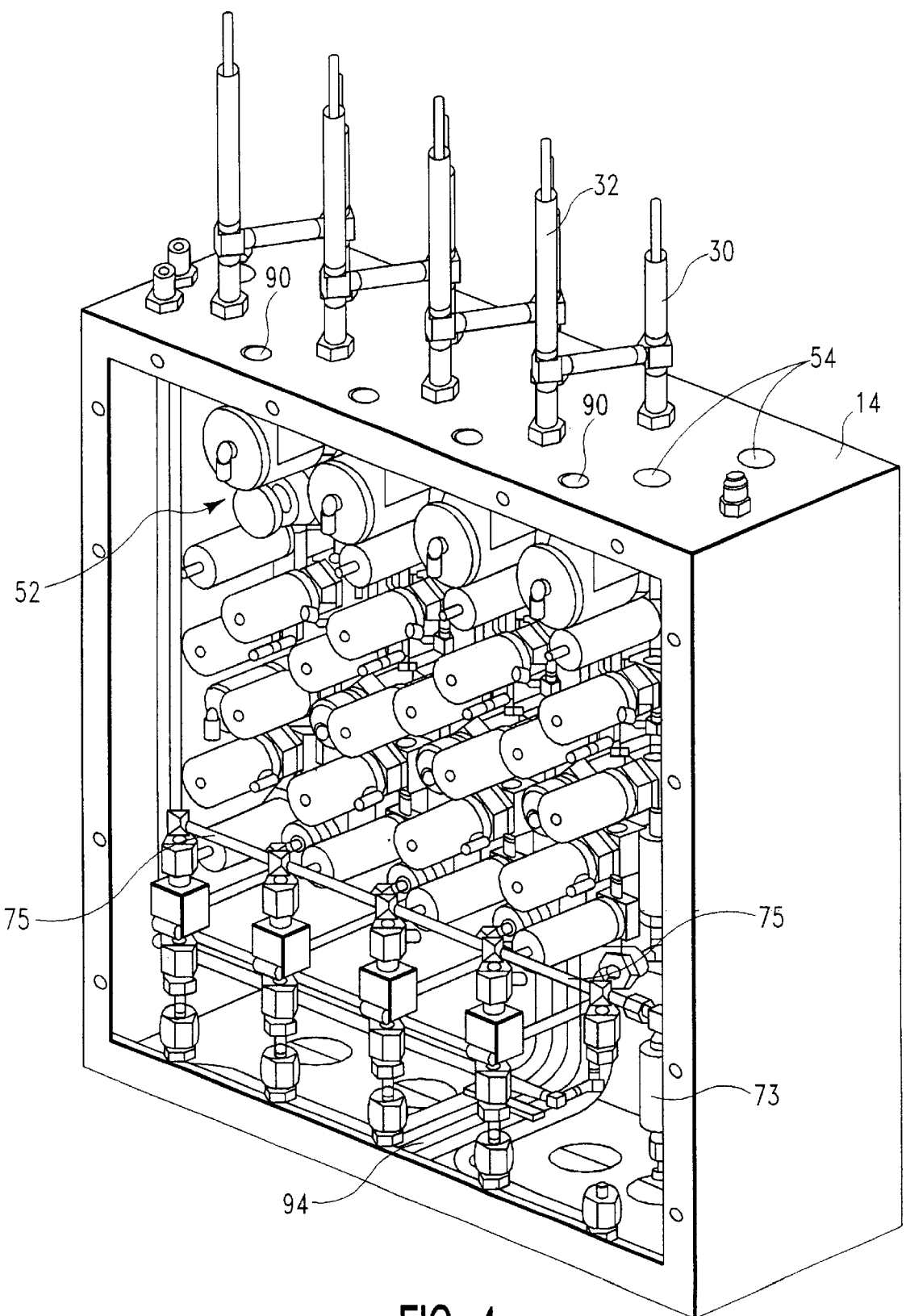
FIG. 4 is a perspective schematical drawing of the enclosure and gas sticks of the gas isolation box according to the present invention.

Referring now to FIG. 4, the door 26 (as shown in FIG. 3) has been removed from enclosure 14 to reveal a plurality of gas sticks 52. As shown in FIG. 4, there are 4 gas sticks with all their associated plumbing. The embodiment of the enclosure 14 shown in FIG. 4 has capacity for 5 gas sticks, although only 4 are present. The GIB may be designed so as to accommodate more or less than 5 gas sticks at a given time.

Figure 8:
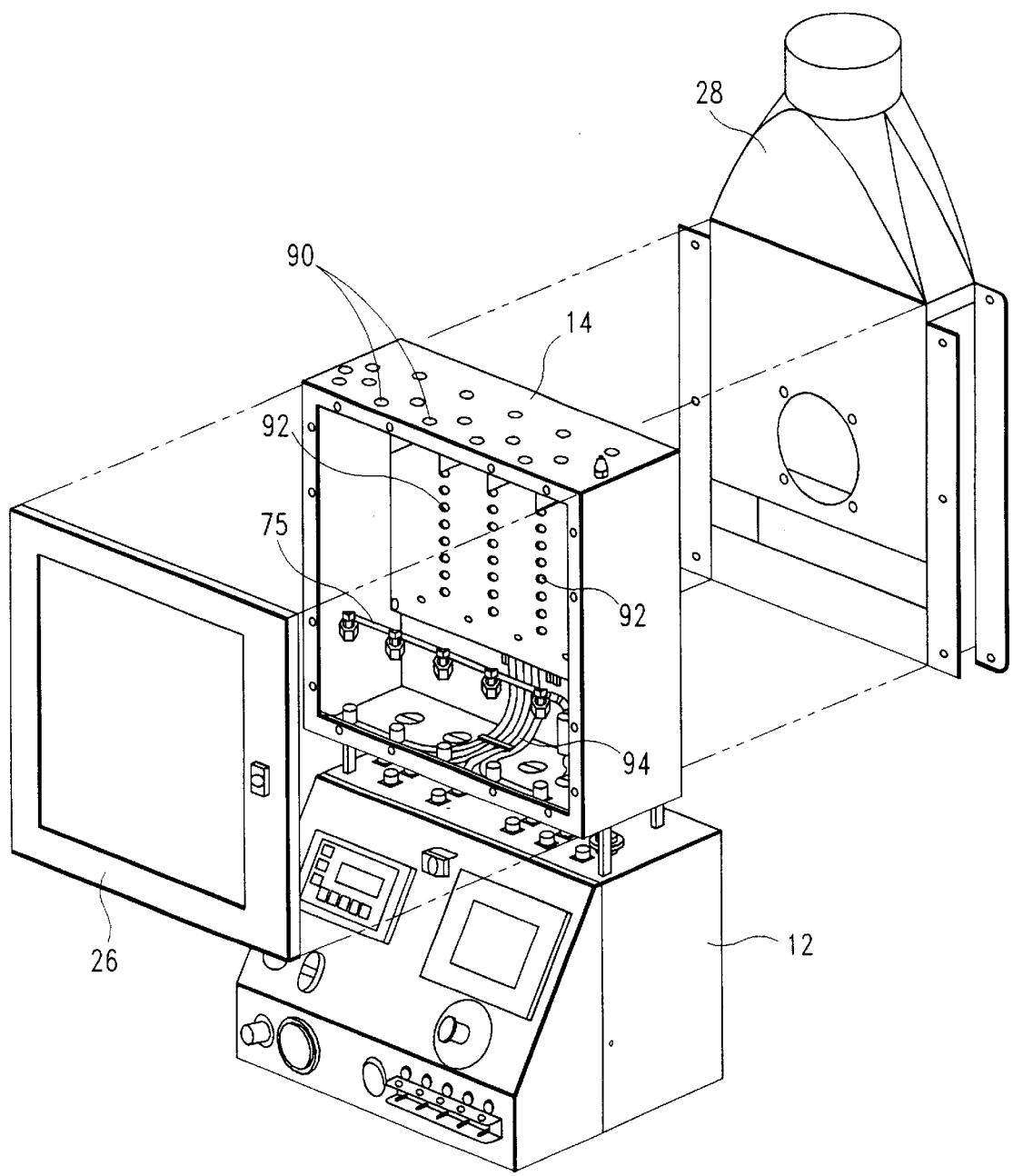
FIG. 8 is a perspective exploded view of the enclosure of the gas isolation box according to the present invention.

For safety reasons, the enclosure is pressurized. Ambient air should flow at a rate of about 100 linear feet/minute past each potential leak point in the enclosure 14. Referring now to FIGS. 4 and 8, fresh ambient air is drawn into the enclosure 14 through perforations 90 located on the exterior of the enclosure 14 and out the back through perforations 92 into exhaust 28 to remove any process gases that might be leaking from the various components of the gas sticks 52. Perforations 92 are situated so as to be between adjacent gas sticks. Perforations 54 in enclosure 14 as shown in FIG. 4 would normally be filled with the supply and outlet lines 30, 32 respectively, of a fifth gas stick.

Figure 5:
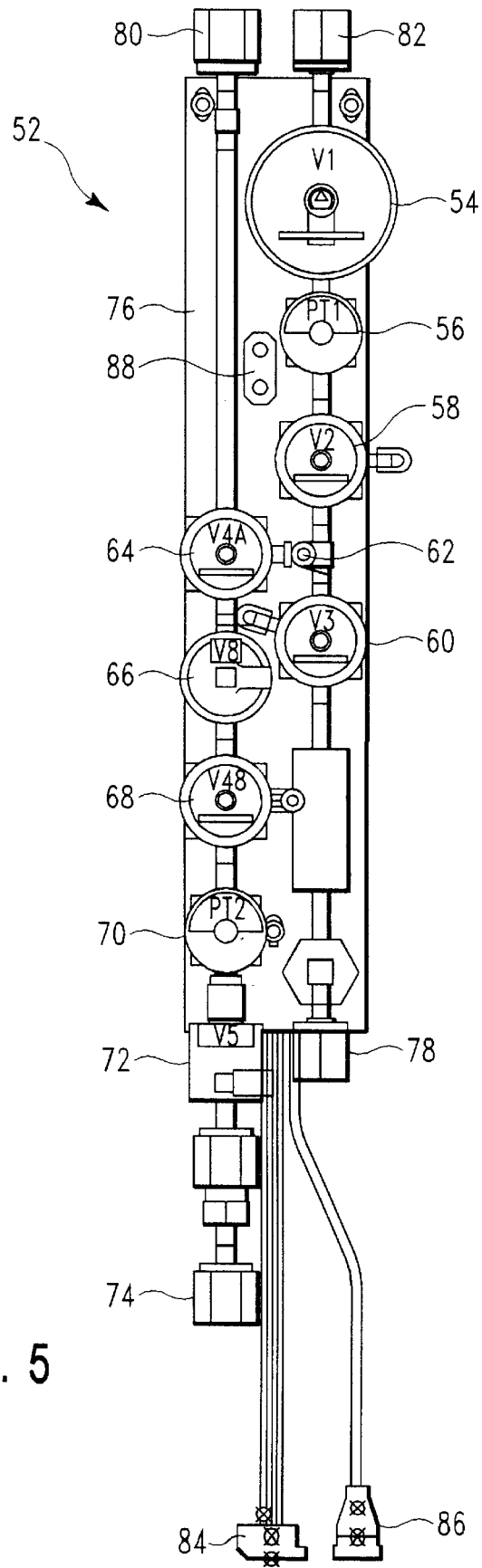
FIG. 5 is an elevational view of one of the gas sticks according to the present invention.
Figure 6:
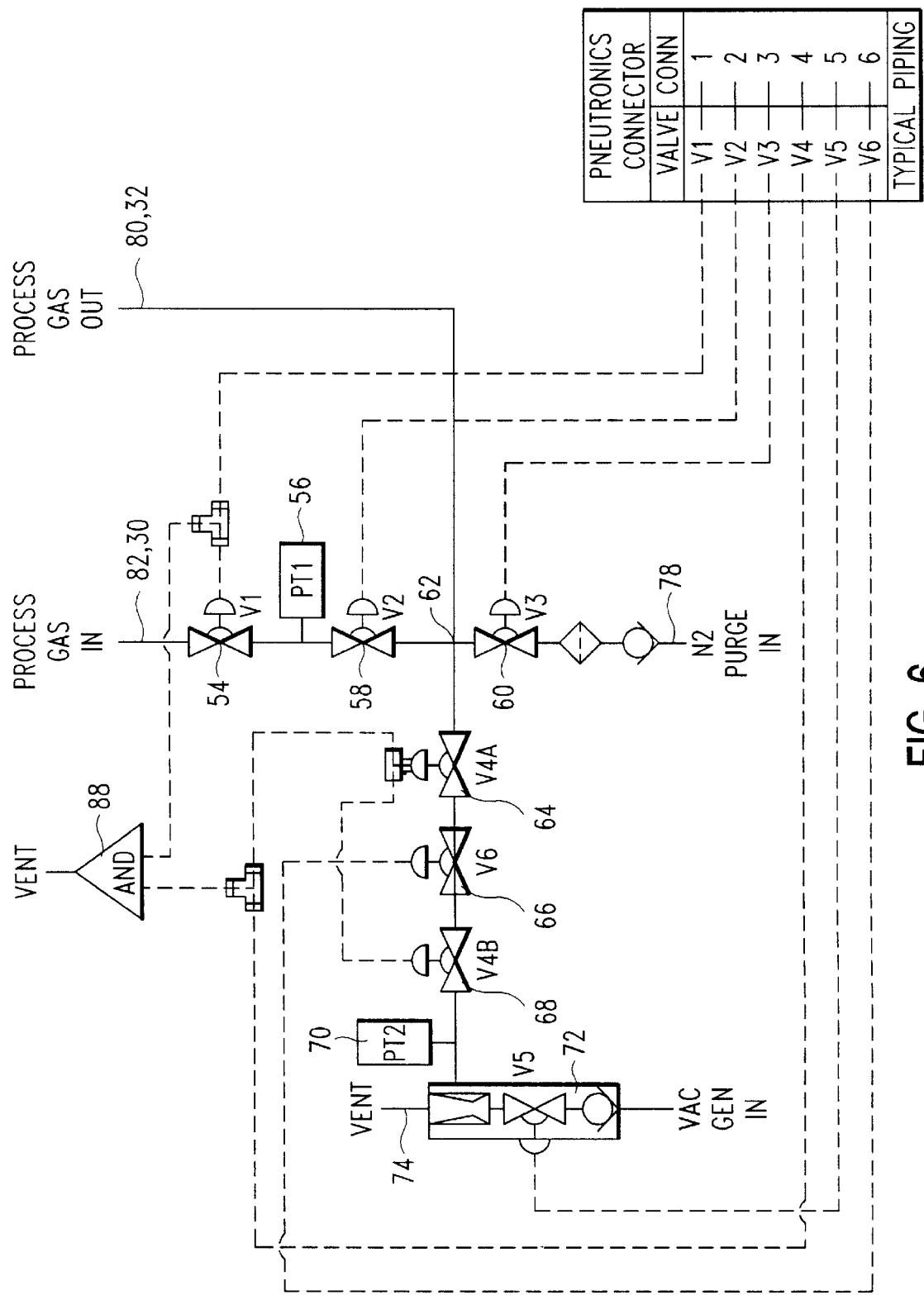
FIG. 6 is a schematic of the pneumatic piping of the gas isolation box according to the present invention.

Referring now to FIG. 5, there is illustrated one of the gas sticks 52 according to the present invention. All of the components of the gas stick 52 are mounted on rigid base 76 and then fastened to the interior of enclosure 14. The components of the gas stick 52 include a fitting 82 for connecting to the supply line 30, a first inlet valve 54 (V1), a first pressure transducer 56 (PT1), a second inlet valve 58 (V2), crossover 62, purge valve 60 (V3), a fitting 78 for connecting the gas stick 52 to a purge gas supply (e.g., nitrogen), fitting 80 for connecting the gas stick 52 to outlet line 32 to the tool, first evacuation valve 64 (V4A), bleed valve 66 (V6), second evacuation valve 68 (V4B), a second transducer 70 (PT2), vacuum generator module 72 (V5), fitting 74 for connecting to an exhaust line 94 (shown in FIGS. 4 and 8) to exhaust 28, pneumatic harness 84 and electrical harness 86. A schematic diagram of the pneumatic piping of gas stick 52 is shown in FIG. 6.

The operation of the gas stick 52 will be described with reference to FIGS. 5 and 6. The gas stick 52 consists of 3 sections, namely, the process gas isolation section, the purge gas section and the evacuation section.

The process gas isolation section controls the flow of the process gas to the tool 18 and consists of inlet valve V1 54 which may be, for example, a bellows or diaphragm valve. Preferably, the process gas isolation section further comprises a pressure transducer PT1 56 and a second inlet valve V2 58, which may also be a bellows or diaphragm valve. While the process gas isolation section will work well without PT1 56 and V2 58, both of these items are present for safety reasons. Preferably, V1 54 is a high pressure valve (e.g., rated for 3500 psi) while V2 58 is a low pressure valve (e.g., rated for 125 psi). V1 54 is open only when process gas is to be fed to the tool 18. V1 54 is closed at all other times.

The purge gas section serves as a purge gas supply source which can flow purge gas (e.g., nitrogen, argon, etc.) through the process gas isolation section (up to V1 54), the evacuation section, and the process gas outlet line 32 to the tool 18. The purge gas section includes valve V3, preferably a low pressure bellows or diaphragm valve.

The evacuation section includes evacuation valve V4A 64, bleed valve V6 66, and vacuum generator module V5 72. Preferably, there is also a second evacuation valve V4B 68 and pressure transducer PT2 70 which, again, are present for safety reasons. Valves V4A 64 and V4B 68 are preferably low pressure bellows or diaphragm valves. The vacuum generator module V5 72 is a combination valve, check valve and venturi in one unit. The bleed valve V6 66 is preferably a diaphragm valve with an 0.008 inch orifice drilled through from the inlet to the outlet. When the bleed valve V6 66 is closed, process gas can slowly pass (i.e., bleed) through the orifice in the bleed valve V6 66. When the bleed valve V6 66 is open, process gas can freely pass through. Nitrogen (or similar gas) is flowed through the venturi of V5 72, creating a vacuum to evacuate the process gases from gas stick 52 and process gas outlet line 32 while also creating an exhaust flow stream for diluting the process gas in the exhaust flow stream. The diluted process gases are evacuated through the valve portion of vacuum generator module V5 72. The bleed valve V6 66 is used to limit the concentration of toxic, corrosive, flammable and pyrophoric process gases which can be safely vented into the exhaust system. When the bleed valve V6 66 is closed, process gas bleeds into the nitrogen exhaust flow stream so that the process gas becomes diluted. In general, the process gases should be diluted to 2–10 volume % of the nitrogen exhaust flow stream prior to venting to the exhaust 28.

The difference in flow rates between when the bleed valve V6 66 is closed and when the bleed valve V6 66 is opened depends on the process gas, its specific gravity and the size of the orifice in the diaphragm. The bleed valve V6 66 would be sized for the process gases that are anticipated to be used. Silane, for example, has a flow rate of 0.80 liters/minute through the orifice at a pressure of 44.7 psia when then bleed valve V6 66 is closed. When the bleed valve V6 66 is fully open, silane would have a flow rate of 56.6 liters/minute at a pressure of 44.7 psia.

As noted above, second inlet valve V2 58 and second evacuation valve V4B 68 are present for safety reasons. Two valves are required for use in the semiconductor industry in order to eliminate a single point failure. Pressure transducers PT1 56 and PT2 70 are present to measure pressure of the gas (or vacuum) in the gas stick 52 and may be of the capacitance manometer type with a range of –14.7 psig to 100 psig.

The gas isolation box 10 according to the present invention further includes a control module 12 that controls at least some, and usually all, of the functions of the process gas section, purge gas section and evacuation section. The functions are controlled through pneumatics and software by a The control module schematic is illustrated in FIG. 7.

Figure 7:
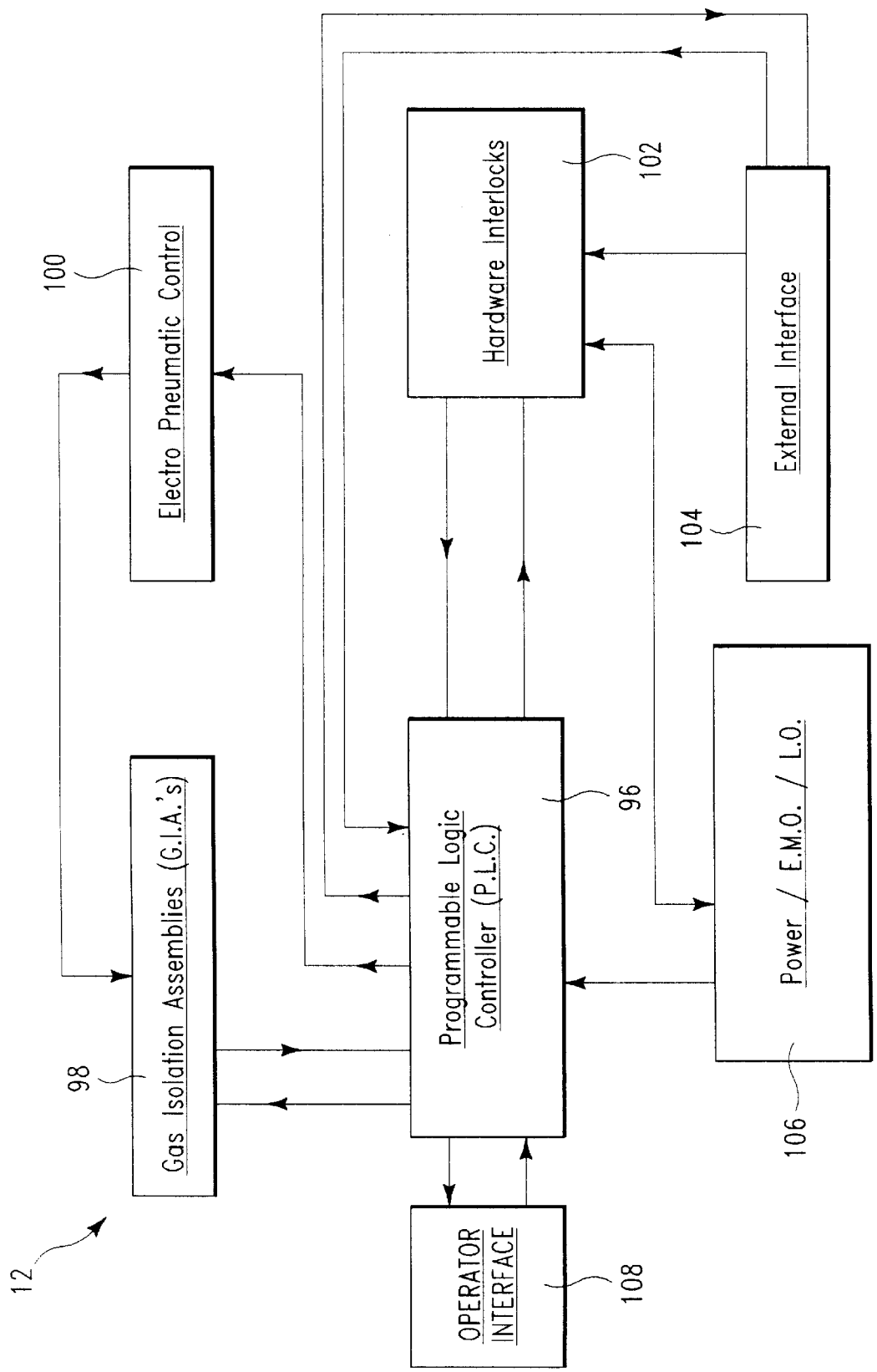
FIG. 7 is a schematic block diagram of the control module that runs the gas isolation box according to the present invention.

Referring now to FIG. 7, the heart of the control module 12 is a programmable logic controller (PLC), indicated by box 96. The PLC used by the present inventor was a Direct Logic 405 PLC. Operator interface 108 interfaces with the PLC 96 to select the operating mode of the individual gas isolation assemblies 98 (i.e., the gas sticks) in the GIB. PLC interfaces with electro-pneumatic control 100 which control the pneumatics on the gas isolation assemblies 98. Electro-pneumatic control 100 is essentially a control panel having a bank of solenoid valves which control the individual valves on the gas isolation assemblies 98. PLC 96 further interfaces with hardware interlocks 102. These hardware interlocks include a GIB door switch, facility exhaust switch, exhaust temperature switch and main pressure switch which will be discussed in more detail hereafter. If there is a fault due to any of these switches, the hardware interlocks 102 causes the PLC 96 to shut the GIB down. External interface 104 is a remotely located control panel which allows an operator to monitor the FIB and shut it down if necessary. Lastly, power/emergency off (EMO) button/lock out 106 includes the power switch, the emergency off button as discussed previously, and the lock out function which allows the operator to disable an individual gas stick and lock it in the disable position. The lock out function will be discussed in more detail hereafter.

The control module 12 may be adjacent to the enclosure 14, as illustrated in FIG. 1, or separated from the enclosure 14, as illustrated in FIG. 2. For example, the enclosure 14 with the plurality of gas sticks 52 may be located in the floor near the tool 18 while the control module 12 is separately located near or on the tool 18.

All components of the GIB should be made of a corrosion resistant material, for example stainless steel, due to the corrosive nature of many of the process gases in use today.

The gas isolation box according to the present invention is capable of operating in a number of operation modes, preferably driven by the control module. These modes are FAULT, ON, SYSTEM PURGE, SYSTEM EVACUATE, TOOL PUMP/PURGE, LOCAL EVACUATE, and LOCAL PUMP/PURGE. Each of these modes will be described in detail.

In the FAULT mode, all valves on the selected gas stick 52 are shut when a fault is detected. The faults detected by the system include GIB door switch fault, facility exhaust switch fault, exhaust temperature switch fault and main pressure switch fault. As noted earlier with respect to FIG. 3, enclosure 14 has a door 26 to provide access to the gas sticks 52 in the enclosure 14. There is a magnetically operated reed switch (not shown) located on the inside of the GIB door. If the switch detects that the GIB door is not closed, a fault is created and all gas sticks will go into FAULT mode. The facility exhaust switch indicates that there is sufficient exhaust flow in the exhaust system. Insufficient exhaust flow will open the switch and create a fault. The exhaust temperature switch is a thermal switch that measures the temperature in the exhaust and verifies that no flames are present in the exhaust duct. The main pressure switch indicates a fault when there is insufficient pneumatic pressure to drive the pneumatic valves.

In the ON mode, inlet valves V1 54 and V2 58 are opened while purge valve V3 60 and evacuation valves V4A 64 and V4B 68 are left closed. Process gas is then allowed to flow to the tool 18. The gas pressure is monitored by pressure transducer PT1.

In the SYSTEM PURGE mode, the purge gas section is enabled to purge the tool 18 of process gas. The only valves open are inlet valve V2 58 and purge gas valve V3 60. The purge gas (e.g., nitrogen) thus flows through the gas stick 52 and the tool 18 to purge the tool 18 of process gas. The. presence of the purge gas can be verified by monitoring the pressure reading on PT1 56.

In the SYSTEM EVACUATE mode, only inlet valve V2 58 is opened and the tool's vacuum system removes any process gas in the gas stick 52 and tool 18. The presence of a vacuum can be monitored on PT1 56.

In the TOOL PUMP/PURGE mode, SYSTEM EVACUATE and SYSTEM PURGE are alternated a predetermined number of times. That is, only inlet valve V2 58 is opened and the tool's vacuum system removes any process gas in the gas stick 52 and tool 18. The presence of a vacuum can be monitored on PT1 56. Then, purge gas valve V3 60 is opened and purge gas flows through the gas stick 52 and the tool 18. The presence of the purge gas can be verified by monitoring the pressure reading on PT1 56. V3 60 is then closed and then SYSTEM EVACUATE begins again, followed by SYSTEM PURGE again and so on until the desired number of iterations have been completed. For purposes of illustration and not limitation, the present inventor has determined that 8 iterations is sufficient.

When there is a failure at the tool such that SYSTEM EVACUATE cannot take place, the process gas present needs to be evacuated. Such evacuation would take place by the LOCAL EVACUATE mode. In the LOCAL EVACUATE mode, inlet valve V2 58 and the valve in the vacuum generator module V5 72 are opened. Nitrogen (or other similar gas) is flowed through vacuum switch 73 (shown in FIG. 4), nitrogen manifold 75 (shown in FIG. 4) and then the venturi of V5 72. When sufficient nitrogen is flowing through vacuum switch 73, vacuum switch 73 will close (i.e., be ON) indicating a vacuum being generated. There is an interlock such that the valve in vacuum generator module V5 72 is not opened until sufficient vacuum is generated. The presence of the vacuum is verified by the PLC at PT2 70. Then evacuation valves V4A 64 and V4B 68 are opened allowing process gas to bleed through the orifice in bleed valve V6 66. In a preferred embodiment of the present 415 invention, evacuation valves V4A 64 and V4B 68 are not opened until the PLC verifies that vacuum switch 73 is closed and that PT2 70 reads a negative pressure (e.g., −11.5 psig or less) indicating a vacuum. When a sufficient vacuum is read on PT1 56, the tool 18 and gas stick 52 will have been sufficiently evacuated and the process gas removed. By allowing the process gas to bleed through bleed valve V6 66 and mix with the nitrogen (or other similar gas) flowing through V5 72, it is assured that, the amount of process gas in the nitrogen stream and the exhaust 28 will not exceed 10 volume %, and especially 2 volume % for pyrophoric gases. If desired, bleed valve V6 66 may be fully opened to complete the evacuation of the system.

A last mode of the gas isolation box according to the present invention is the LOCAL PUMP/PURGE mode. Again, this mode would be used in the case of tool failure as described above. In this mode, the gas stick 52 undergoes SYSTEM EVACUATE as just described above. All valves except inlet valve V2 58 will close. Purge gas valve V3 60 is opened to allow purge gas to fill the gas stick 52 and the piping in the tool 18. The pressure is monitored on PT1 56. Purge gas valve V3 60 is closed. Evacuation then takes place by opening vacuum generator module V5 72, evacuation valve V4A 64, bleed valve V6 66 and evacuation valve 4B 68. After evacuation of the purge gas, purging begins again followed by evacuation and so on until the required number of iterations have been completed.

Because of safety concerns, during the SYSTEM EVACUATE and LOCAL PUMP/PURGE modes, only one gas stick 52 is operable at any one time when the gas stick 52 is evacuating. This prevents incompatible process gases (e.g., an oxidizer and a pyrophoric gas) from mixing in the exhaust duct during evacuation which could cause an explosion or fire.

Each of the gas sticks 52 can be individually disabled by lockout switches 44 located on control module 12 as shown in FIG. 3. If it is desired to disable a gas stick 52, the lockout switch for that gas stick 52 will be toggled over to DISABLE and then a lock is placed next to the lockout switch to lock it in the DISABLE position.

Referring back to FIGS. 5 and 6, the gas stick 52 further comprises an AND valve 88 which is linked to both inlet valve V1 54 and evacuation valves V4A, V4B 64, 68. Inlet valve V1 54 and evacuation valves V4A, V4B 64, 68 should never be open at the same time as this would allow process gas to be directly exhausted. The PLC should never let these valves open at the same time. As a safety precaution, however, AND valve 88 is present on the gas stick 52. Preferably, AND valve 88 is a pneumatic AND gate and would work as follows. If pneumatic pressure is sensed that inlet valve V1 54 and evacuation valves V4A, V4B 64, 68 are to be opened at the same time (i.e., AND=1), pneumatic pressure is dumped to atmosphere and inlet valve V1 54 and evacuation valves V4A, V4B 64, 68 will not open. A fault would be detected as no pressure at PT1 56 and the gas isolation box would go into the FAULT mode.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A gas isolation box comprising:
    an enclosure;
    a plurality of gas sticks contained within the enclosure, each gas stick comprising:
        a process gas section comprising a first process gas inlet valve for gating the flow of a process gas into the gas stick;
        a purge gas section comprising a purge valve for gating the flow of a purge gas into the gas stick; and
        an evacuation section for the exiting of a process gas or a purge gas from the gas stick;
    wherein at least a first one of the plurality of gas sticks contains a first process gas and at least a second one of the plurality of gas sticks contains a second process gas wherein the first and second process gases are different.

2. A gas isolation box comprising:
    an enclosure;
    a plurality of gas sticks contained within the enclosure, each gas stick comprising:
        a process gas section comprising a first process gas inlet valve for gating the flow of a process gas into the gas stick;
        a purge gas section comprising a purge valve for gating the flow of a purge gas into the gas stick; and
        an evacuation section for the exiting of a process gas or a purge gas from the gas stick; and
    further comprising a lockout switch for each of the plurality of gas sticks that prevents the first process gas inlet valve from operating when the lockout switch is in a lockout mode.

3. The gas isolation box of claim 2 wherein the evacuation section of only one gas stick of the plurality of gas sticks is enabled at any given time.

4. The gas isolation box of claim 2 further comprising a control module that controls at least some of the functions of the process gas section, purge gas section and evacuation section.

5. The gas isolation box of claim 2 wherein the control module and enclosure are separated.

6. The gas isolation box of claim 2 wherein the gas isolation box is located in a floor.

7. The gas isolation box of claim 2 wherein in operation, the purge section and evacuation section are alternately enabled a predetermined number of times.

8. The gas isolation box of claim 2 wherein in operation, the purge section is alternated between enabled and not enabled a predetermined number of times.

9. A gas isolation box comprising:
    an enclosure;
    a plurality of gas sticks contained within the enclosure, each gas stick comprising:
        a process gas section comprising a first process gas inlet valve for gating the flow of a process gas into the gas stick;
        a purge gas section comprising a purge valve for gating the flow of a purge gas into the gas stick; and
        an evacuation section comprising a first evacuation valve for gating the exiting of a process gas or a purge gas from the gas stick, a bleed valve which in a closed position allows process gas to bleed through the bleed valve and in an open position allows purge gas to freely flow through the bleed valve, and a vacuum generator module which pulls a vacuum to evacuate a purge gas or any remaining process gas in the gas stick or the tool through the first evacuation valve and the bleed valve and out from the gas stick to an exhaust stream.

10. The gas isolation box of claim 9 wherein the process gas section further comprises a second process gas inlet valve downstream of the first process gas inlet valve wherein the first process gas inlet valve is a high pressure valve and the second process gas inlet valve is a low pressure valve.

11. The gas isolation box of claim 10 further comprising a pressure transducer between the first and second process gas inlet valves.

12. The gas isolation box of claim 9 further comprising a second evacuation valve downstream of the first evacuation valve and located between the bleed valve and the vacuum generator module.

13. The gas isolation box of claim 9 further comprising a second pressure transducer downstream of the second evacuation valve and before the vacuum generator module.

14. The gas isolation box of claim 9 further comprising an AND valve in communication with the first evacuation valve and the first process gas inlet valve which prevents the first evacuation valve and the first process gas inlet valve from opening at the same time.

15. The gas isolation box of claim 14 wherein the AND valve comprises a pneumatic logic element.

16. The gas isolation box of claim 9 wherein at least a first one of the plurality of gas sticks contains a first process gas and at least a second one of the plurality of gas sticks contains a second process gas wherein the first and second process gases are different.

17. The gas isolation box of claim 9 further comprising a lockout switch for each of the plurality of gas sticks that prevents the first process gas inlet valve from operating when the lockout switch is in a lockout mode.

18. The gas isolation box of claim 9 further comprising a door on the enclosure, the door having an interlock with the enclosure such that when the door is opened, each of the plurality of gas sticks is disabled.

19. The gas isolation box of claim 9 further comprising a thermal switch.

20. The gas isolation box of claim 9 wherein the evacuation section of only one gas stick of the plurality of gas sticks is enabled at any given time.

21. The gas isolation box of claim 9 further comprising a dilution gas stream into the vacuum generator module, a vacuum switch that registers the flow of the dilution gas stream into the vacuum generator module and an interlock between the vacuum switch and the evacuation valve wherein the evacuation valve is not opened until the vacuum switch registers a predetermined level of flow of the dilution gas stream.

22. The gas isolation box of claim 9 further comprising a dilution gas stream into the vacuum generator module, a vacuum switch that registers the flow of the dilution gas stream into the vacuum generator module, a vacuum measurement apparatus to measure the vacuum generated by the vacuum generator module, and an interlock between the vacuum switch, the vacuum measurement apparatus and the evacuation valve wherein the evacuation valve is not opened until the vacuum switch registers a predetermined level of flow of the dilution gas stream and the vacuum measurement apparatus measures a predetermined level of vacuum generated by the vacuum generator module.

23. The gas isolation box of claim 9 further comprising a dilution gas stream into the vacuum generator module wherein the evacuation section dilutes the process gases to be evacuated to a range of 2 to 10 volume percent of the dilution gas stream prior to evacuation.

24. The gas isolation box of claim 9 further comprising a control module that controls at least some of the functions of the process gas section, purge gas section and evacuation section.

25. The gas isolation box of claim 24 wherein the control module and enclosure are separated.

26. The gas isolation box of claim 9 wherein the gas isolation box is located in a floor.

27. The gas isolation box of claim 9 wherein in operation, the purge section and evacuation section are alternately enabled a predetermined number of times.

28. The gas isolation box of claim 9 wherein in operation, the purge section is alternated between enabled and not enabled a predetermined number of times.

29. A gas isolation box comprising:
  an enclosure having a process gas inlet, a purge gas inlet, a process gas outlet to a tool and an evacuation outlet;
  a plurality of gas sticks contained within the enclosure, each gas stick comprising:
    a process gas section comprising a first process gas inlet valve for gating the flow of a process gas into the gas stick from the process gas inlet and out through the process gas outlet;
    a purge gas section comprising a purge valve for gating the flow of a purge gas into the gas stick from the purge gas inlet and out through the process gas outlet or the evacuation outlet; and
    an evacuation section comprising a first evacuation valve for gating the exiting of a process gas or a purge gas from the gas stick, a bleed valve which in a closed position allows process gas to bleed through the bleed valve and in an open position allows purge gas to freely flow through the bleed valve, and a vacuum generator module which pulls a vacuum to evacuate a purge gas or any remaining process gas in the gas stick or the tool through the first evacuation valve and the bleed valve and out from the gas stick through the evacuation inlet to an exhaust stream;
  wherein in operation, only one of the first process gas inlet valve, purge gas section and evacuation section is operable at any given time.

30. The gas isolation box of claim 29 wherein the process gas section further comprises a second process gas inlet valve downstream of the first process gas inlet valve wherein the first process gas inlet valve is a high pressure valve and the second process gas inlet valve is a low pressure valve.

31. The gas isolation box of claim 30 further comprising a pressure transducer between the first and second process gas inlet valves.

32. The gas isolation box of claim 29 further comprising a second evacuation valve downstream of the first evacuation valve and located between the bleed valve and the vacuum generator module.

33. The gas isolation box of claim 32 further comprising an AND valve in communication with the first evacuation valve and the first process gas inlet valve which prevents the first evacuation valve and the first process gas inlet valve from opening at the same time.

34. The gas isolation box of claim 33 wherein the AND valve comprises a pneumatic logic element.

35. The gas isolation box of claim 29 further comprising a second pressure transducer downstream of the second evacuation valve and before the vacuum generator module.

36. The gas isolation box of claim 29 wherein at least a first one of the plurality of gas sticks contains a first process gas and at least a second one of the plurality of gas sticks contains a second process gas wherein the first and second process gases are different.

37. The gas isolation box of claim 29 further comprising a lockout switch for each of the plurality of gas sticks that prevents the first process gas inlet valve from operating when the lockout switch is in a lockout mode.

38. The gas isolation box of claim 29 further comprising a door on the enclosure, the door having an interlock with the enclosure such that when the door is opened, each of the plurality of gas sticks is disabled.

39. The gas isolation box of claim 29 further comprising a thermal switch.

40. The gas isolation box of claim 29 wherein the evacuation section of only one gas stick of the plurality of gas sticks is enabled at any given time.

41. The gas isolation box of claim 29 further comprising a dilution gas stream into the vacuum generator module, a vacuum switch that registers the flow of the dilution gas stream into the vacuum generator module and an interlock between the vacuum switch and the evacuation valve wherein the evacuation valve is not opened until the vacuum switch registers a predetermined level of flow of the dilution gas stream.

42. The gas isolation box of claim 29 further comprising a dilution gas stream into the vacuum generator module, a vacuum switch that registers the flow of the dilution gas stream into the vacuum generator module, a vacuum measurement apparatus to measure the vacuum generated by the vacuum generator module, and an interlock between the vacuum switch, the vacuum measurement apparatus and the evacuation valve wherein the evacuation valve is not opened until the vacuum switch registers a predetermined level of flow of the dilution gas stream and the vacuum measurement apparatus measures a predetermined level of vacuum generated by the vacuum generator module.

43. The gas isolation box of claim 29 wherein the evacuation section dilutes the process gases to be evacuated to a range of 2 to 10 volume percent of the exhaust stream prior to evacuation.

44. The gas isolation box of claim 29 further comprising a control module that controls at least some of the functions of the process gas section, purge gas section and evacuation section.

45. The gas isolation box of claim 44 wherein the control module and enclosure are separated.

46. The gas isolation box of claim 29 wherein the gas isolation box is located in a floor.

47. The gas isolation box of claim 29 wherein in operation, the purge section and evacuation section are alternately enabled a predetermined number of times.

48. The gas isolation box of claim 29 wherein in operation, the purge section is alternated between enabled and not enabled a predetermined number of times.

49. A gas isolation box comprising:
an enclosure;
a plurality of gas sticks contained within the enclosure, each gas stick comprising:
a process gas section comprising a first process gas inlet valve for gating the flow of a process gas into the gas stick;
a purge gas section comprising a purge valve for gating the flow of a purge gas into the gas stick; and
an evacuation section for the exiting of a process gas or a purge gas from the gas stick; and
further comprising a door on the enclosure, the door having an interlock with the enclosure such that when the door is opened, each of the plurality of gas sticks is disabled.

50. A gas isolation box comprising:
an enclosure having a process gas inlet, a purge gas inlet, a process gas outlet to a tool and an evacuation outlet;
a plurality of gas sticks contained within the enclosure, each gas stick comprising:
a process gas section comprising a first process gas inlet valve for gating the flow of a process gas into the gas stick from the process gas inlet and out through the process gas outlet;
a purge gas section comprising a purge valve for gating the flow of a purge gas into the gas stick from the purge gas inlet and out through the process gas outlet or the evacuation outlet; and
an evacuation section comprising a first evacuation valve for gating the exiting of a process gas or a purge gas from the gas stick, a bleed valve which in a closed position allows process gas to bleed through the bleed valve and in an open position allows purge gas to freely flow through the bleed valve, and a vacuum generator module which pulls a vacuum to evacuate a purge gas or any remaining process gas in the gas stick or the tool through the first evacuation valve and the bleed valve and out from the gas stick through the evacuation inlet to an exhaust stream;
wherein in operation, each of the gas sticks is capable of performing the following operations:
during an ON mode, the first process gas inlet valve is opened, the purge gas section and evacuation section are not enabled so as to supply the tool with process gas;
during a SYSTEM PURGE mode,the purge gas section is enabled to purge the tool of process gas and the process gas section and evacuation section are not enabled;
during a TOOL PUMP/PURGE mode, the purge section is alternately enabled and disabled a predetermined number of times to purge the tool of process gas;
during a LOCAL EVACUATE mode, the evacuation section is enabled to evacuate process gas from the tool and the process gas section and purge gas section are not enabled; and
during a LOCAL PUMP/PURGE mode, the evacuation section and the purge section are alternately enabled to evacuate and purge process gas from the tool and the process gas section is not enabled.

51. The gas isolation box of claim 50 further comprising a control module that controls at least some of the functions of the process gas section, purge gas section and evacuation section.

52. The gas isolation box of claim 50 wherein the enclosure has a first set of perforations for entry of ambient air into the enclosure and a second set of perforations for the exit of ambient air from the enclosure and wherein, in operation, ambient air flows between the first and second set of perforations.

53. A gas stick comprising:
a process gas section comprising a first process gas inlet valve for gating the flow of a process gas into the gas stick;
a purge gas section comprising a purge valve for gating the flow of a purge gas into the gas stick; and
an evacuation section comprising a first evacuation valve for gating the exiting of a process gas or a purge gas from the gas stick, a bleed valve which in a closed position allows process gas to bleed through the bleed valve and in an open position allows purge gas to freely flow through the bleed valve, and a vacuum generator module which pulls a vacuum to evacuate a purge gas or any remaining process gas in the gas stick or the tool through the first evacuation valve and the bleed valve and out from the gas stick to an exhaust stream.

54. A gas stick comprising:

a process gas section comprising a first process gas inlet valve for gating the flow of a process gas into the gas stick from the process gas inlet and out through the process gas outlet;

a purge gas section comprising a purge valve for gating the flow of a purge gas into the gas stick from the purge gas inlet and out through the process gas outlet or the evacuation outlet; and an evacuation section comprising a first evacuation valve for gating the exiting of a process gas or a purge gas from the gas stick, a bleed valve which in a closed position allows process gas to bleed through the bleed valve and in an open position allows purge gas to freely flow through the bleed valve, and a vacuum generator module which pulls a vacuum to evacuate a purge gas or any remaining process gas in the gas stick or the tool through the first evacuation valve and the bleed valve and out from the gas stick through the evacuation inlet to an exhaust stream;

wherein in operation, only one of the first process gas inlet valve, purge gas section and evacuation section is operable at any given time.

55. A gas stick comprising:

a process gas section comprising a first process gas inlet valve for gating the flow of a process gas into the gas stick from the process gas inlet and out through the process gas outlet;

a purge gas section comprising a purge valve for gating the flow of a purge gas into the gas stick from the purge gas inlet and out through the process gas outlet or the evacuation outlet; and an evacuation section comprising a first evacuation valve for gating the exiting of a process gas or a purge gas from the gas stick, a bleed valve which in a closed position allows process gas to bleed through the bleed valve and in an open position allows purge gas to freely flow through the bleed valve, and a vacuum generator module which pulls a vacuum to evacuate a purge gas or any remaining process gas in the gas stick or the tool through the first evacuation valve and the bleed valve and out from the gas stick through the evacuation inlet to an exhaust stream;

wherein in operation, each of the gas sticks is capable of performing the following operations:

during an ON mode, the first process gas inlet valve is opened, the purge gas section and evacuation section are not enabled so as to supply the tool with process gas;

during a SYSTEM PURGE mode, the purge gas section is enabled to purge the tool of process gas and the process gas section and evacuation section are not enabled;

during a TOOL PUMP/PURGE mode, the purge section is alternately enabled and disabled a predetermined number of times to purge the tool of process gas;

during a LOCAL EVACUATE mode, the evacuation section is enabled to evacuate process gas from the tool and the process gas section and purge gas section are not enabled; and during a LOCAL PUMP/PURGE mode, the evacuation section and the purge section are alternately enabled to evacuate and purge process gas from the tool and the process gas section is not enabled.

56. A gas isolation box comprising:

an enclosure;

a plurality of gas sticks contained within the enclosure, each gas stick comprising;

a process gas section comprising a first process gas inlet valve for gating the flow of a process gas into the gas stick;

a purge gas section comprising a purge valve for gating the flow of a purge gas into the gas stick; and an evacuation section for the exiting of a process gas or a purge gas from the gas stick;

wherein the enclosure has a first set of perforations for entry of ambient air into the enclosure and a second set of perforations for the exit of ambient air from the enclosure and wherein, in operation, ambient air flows between the first and second set of perforations.

57. The gas isolation box of claim 9 wherein the enclosure has a first set of perforations for entry of ambient air into the enclosure and a second set of perforations for the exit of ambient air from the enclosure and wherein, in operation, ambient air flows between the first and second set of perforations.

58. The gas isolation box of claim 29 wherein the enclosure has a first set of perforations for entry of ambient air into the enclosure and a second set of perforations for the exit of ambient air from the enclosure and wherein, in operation, ambient air flows between the first and second set of perforations.

* * * * *